(12) United States Patent
Tseng et al.

(10) Patent No.: US 9,584,023 B2
(45) Date of Patent: Feb. 28, 2017

(54) VOLTAGE CONVERTER

(71) Applicant: COMPAL BROADBAND NETWORKS INC., Taipei (TW)

(72) Inventors: Shih-Ting Tseng, Hsinchu County (TW); Hung-Wei Chen, Hsinchu County (TW); Tun-Ta Liao, Hsinchu County (TW)

(73) Assignee: COMPAL BROADBAND NETWORKS INC., Taipei (TW)

( * ) Notice: Subject to any disclaimer, the term of this patent is extended or adjusted under 35 U.S.C. 154(b) by 0 days.

(21) Appl. No.: 15/063,513

(22) Filed: Mar. 8, 2016

(65) Prior Publication Data

US 2017/0019028 A1 Jan. 19, 2017

Related U.S. Application Data

(60) Provisional application No. 62/193,099, filed on Jul. 16, 2015.

(30) Foreign Application Priority Data

Dec. 25, 2015 (TW) .............................. 104220806 U

(51) Int. Cl.
*H02M 3/24* (2006.01)
(52) U.S. Cl.
CPC .................................... *H02M 3/24* (2013.01)
(58) Field of Classification Search
CPC ...... H02M 3/24; H02M 3/33507; H02M 1/32; H02M 1/36; H02M 2001/0022; H02M 3/156; H02M 3/33523; H02M 2001/0019; H02H 3/24; H02H 1/0007; G01R 19/16538; G01R 19/00; G06F 1/26; G06F 1/28; G06F 1/30
See application file for complete search history.

(56) References Cited

U.S. PATENT DOCUMENTS

| | | | |
|---|---|---|---|
| 8,716,996 B2* | 5/2014 | Sugawara | H02M 1/4225 323/283 |
| 2009/0174386 A1* | 7/2009 | Popescu | H02H 9/001 323/303 |
| 2009/0268488 A1* | 10/2009 | Fujii | H02M 1/32 363/49 |
| 2013/0083562 A1* | 4/2013 | Wu | H02M 1/32 363/16 |

(Continued)

*Primary Examiner* — Adolf Berhane
*Assistant Examiner* — Henry Lee, III
(74) *Attorney, Agent, or Firm* — Winston Hsu; Scott Margo

(57) ABSTRACT

A voltage converter for determining whether input power is DC power or AC power includes a power input terminal, an AC to DC converter, a switch and a DC detector. The AC to DC converter converts AC power into a DC output voltage when the input power is AC power. The AC to DC converter includes a brown-out detector, for disabling the AC to DC converter when a voltage of the input power is smaller than a predefined voltage. The switch passes DC power when the input power is DC power. The DC detector determines that the input power is DC power and turns on the switch when the voltage of the input power is within a predefined voltage range, and determines that the input power is AC power and turns off the switch when the voltage of the input power is not within the predefined voltage range.

10 Claims, 2 Drawing Sheets

(56) References Cited

U.S. PATENT DOCUMENTS

| | | | |
|---|---|---|---|
| 2015/0160287 A1* | 6/2015 | Huang | H02H 3/24 |
| | | | 324/537 |
| 2015/0207311 A1* | 7/2015 | Chang | H02H 3/20 |
| | | | 361/91.1 |
| 2015/0280585 A1* | 10/2015 | Hayakawa | H02M 3/33515 |
| | | | 363/21.13 |

* cited by examiner

VOLTAGE CONVERTER

CROSS REFERENCE TO RELATED APPLICATIONS

This application claims the benefit of U.S. Provisional Application No. 62/193,099, filed on Jul. 16, 2015, the contents of which are incorporated herein by reference.

BACKGROUND OF THE INVENTION

1. Field of the Invention

The present invention relates to a voltage converter, and more particularly, to a voltage converter capable of receiving direct current (DC) power and alternating current (AC) power on the same terminal.

2. Description of the Prior Art

Network communication products in the market, such as the cable modem and network server, provide media for signal communications between network clouds and household electronic products. Most of the network communication products are equipped with phone-call functions. Also, several countries specify those devices having phone-call functions should still possess emergency call functionalities during power outage; hence, the network communication products should be equipped with battery(s) for usage of emergency calls. At the present, the disposition of battery(s) for the network communication products has two common methods, one of which is embedding the battery(s) in the network communication products, and the other is utilizing an external battery box or an uninterruptible power system (UPS) externally connected to the network communication products. In general, the implementation of built-in battery(s) may lead to larger network communication products, which also have higher costs. In contrast, the implementation by utilizing the external battery box or the UPS is more flexible.

Thus, there is a need to provide a voltage converter used for the network communication products. The voltage converter is capable of receiving power from the external battery box or the UPS, and effectively determining whether the received power is DC power or AC power, in order to perform appropriate processing.

SUMMARY OF THE INVENTION

It is therefore an objective of the present invention to provide a voltage converter for the network communication products. The voltage converter may receive power from the external battery box or uninterruptible power system (UPS), and determine whether the received power is direct current (DC) power or alternating current (AC) power.

The present invention discloses a voltage converter for determining whether an input power is DC power or AC power. The voltage converter comprises a power input terminal, an AC to DC converter, a switch and a DC detector. The power input terminal is used for receiving the input power. The AC to DC converter, coupled to the power input terminal, is used for converting the AC power into a DC output voltage when the input power is the AC power. The AC to DC converter comprises a brown-out detector for disabling the AC to DC converter when a voltage of the input power is smaller than a predefined voltage and enabling the AC to DC converter when the voltage of the input power is greater than the predefined voltage. The switch, coupled to the power input terminal, is used for passing the DC power when the input power is the DC power. The DC detector, coupled to the power input terminal and the switch, is used for determining that the input power is the DC power and turning on the switch when the voltage of the input power is within a first predefined voltage range, and determining that the input power is the AC power and turning off the switch when the voltage of the input power is not within the first predefined voltage range.

These and other objectives of the present invention will no doubt become obvious to those of ordinary skill in the art after reading the following detailed description of the preferred embodiment that is illustrated in the various figures and drawings.

DETAILED DESCRIPTION

In general, the main purpose of the external battery box or the uninterruptible power system (UPS) is to supply power when power outage, allowing the back-end network communication product to operate normally. For example, a common UPS including battery(s) may receive alternating current (AC) power from mains electricity in usual and transfer the AC power to an output terminal. The redundant power is stored in the battery(s). When power outage occurs, the UPS may use the power stored in the battery(s) to supply power; that is, the direct current (DC) power outputted by the battery(s) is converted into the AC power having similar characteristics as the mains electricity and then outputted. However, such a processing is more complex and has a higher cost. Further, if the back-end network communication product needs to receive DC power, the AC power outputted by the UPS should be reverted to the DC power. The operations of DC-AC-DC may result in unnecessary energy consumptions.

Therefore, the new type UPS is capable of directly outputting the DC power of the battery(s) without converting the DC power to the AC power during power outage, and the UPS may also transfer the AC mains electricity in usual. In such a condition, the output terminal of the UPS may have the capability of outputting both of the DC power and AC power. When the mains electricity is supplied normally, the power of the UPS is AC power from the mains electricity. When power outage occurs or other circumstances causing that the mains electricity fails to be supplied normally, the power of the UPS is DC power generated from the battery(s).

In order to comply with the new type UPS, the present invention provides a voltage converter used for the network communication products. The voltage converter, coupled to the output terminal of the UPS, may receive power from the UPS and determine whether the received power is DC power or AC power, in order to perform appropriate processing. In general, the voltage value of mains electricity may have different values, e.g., 110 volts or 220 volts, according to the regulation of every country. The voltage, i.e., 110 volts or 220 volts, refers to the effective value of an AC voltage, and the corresponding peak value (i.e., multiplied by the square root of 2) is substantially 156 volts or 311 volts, respectively. In contrast, the battery always has a lower voltage. According to common specifications of the battery in the UPS, the DC voltage of the battery substantially ranges from 12 to 48 volts. Since the voltage values of the AC power and DC power have no small difference, the voltage converter of the present invention may determine that the received power is DC power or AC power according to the voltage value of the received power.

Figure 1:
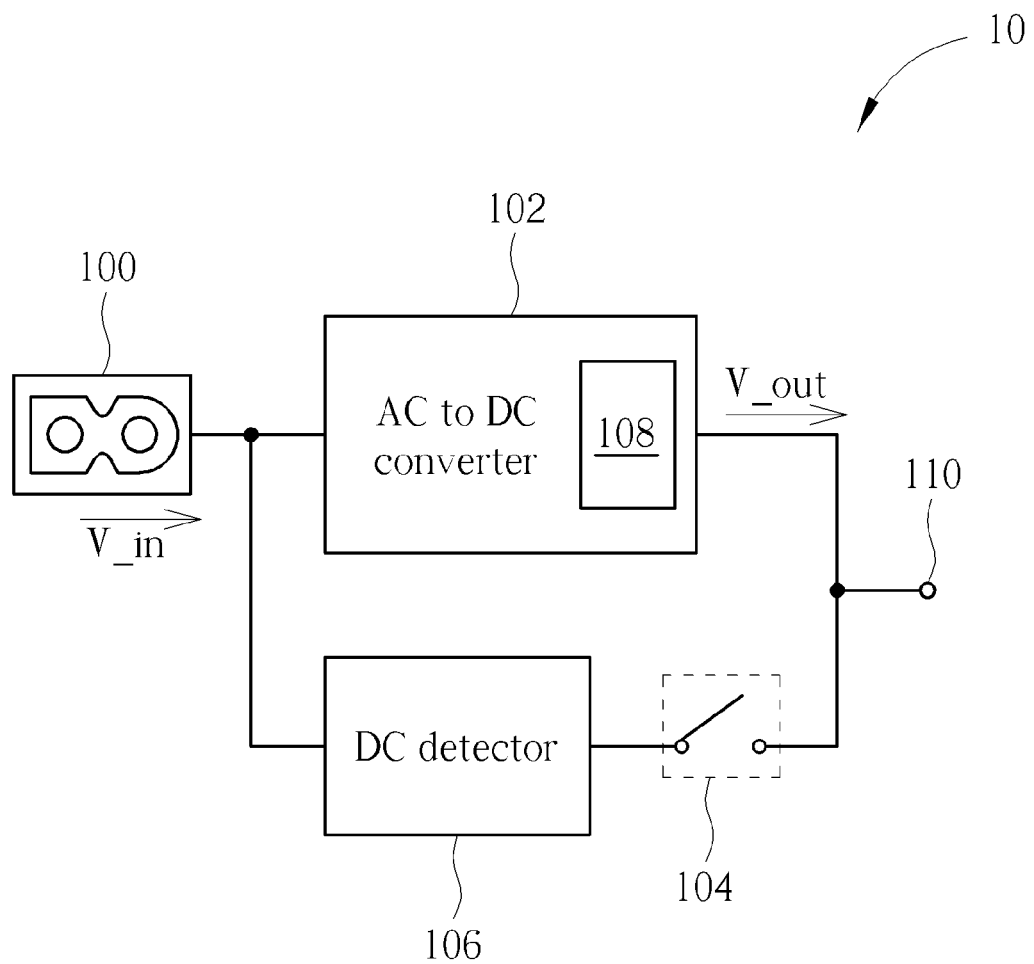
FIG. 1 is a schematic diagram of a voltage converter according to an embodiment of the present invention.

Please refer to FIG. 1, which is a schematic diagram of a voltage converter 10 according to an embodiment of the present invention. As shown in FIG. 1, the voltage converter 10 includes a power input terminal 100, an AC to DC converter 102, a switch 104, a DC detector 106 and a power output terminal 110. The power input terminal 100 is coupled to an output terminal of a power supply module in the front end. The power supply module may be an external battery box or a UPS. The power input terminal 100 may receive an input power $V\_in$ from the power supply module. The AC to DC converter 102, coupled to the power input terminal 100, is used for converting AC power into a DC output voltage $V\_out$ when the input power $V\_in$ is AC power. The AC to DC converter 102 then outputs the DC output voltage $V\_out$ to the power output terminal 110. The AC to DC converter 102 includes a brown-out detector 108, which may disable the AC to DC converter 102 when the voltage of the input power $V\_in$ is smaller than a predefined voltage and enable the AC to DC converter 102 when the voltage of the input power $V\_in$ is greater than the predefined voltage. The switch 104 is coupled to the power input terminal 100 and the DC detector 106. When the input power $V\_in$ is DC power, the switch 104 is used for passing the DC power to output the DC power to the power output terminal 110. The DC detector 106, coupled to the power input terminal 100 and the switch 104, may determine that the input power $V\_in$ is DC power and turn on the switch 104 when the voltage of the input power $V\_in$ is within a predefined voltage range, and determine that the input power $V\_in$ is AC power and turn off the switch 104 when the voltage of the input power $V\_in$ is not within the predefined voltage range. The power output terminal 110 may output power to a device using the voltage converter 10, where the device may be a network communication product. In addition, the power output terminal 110 may further be connected a DC to DC converter, to convert the voltage of the power output terminal 110 into any voltage value, to supply power for every module in the network communication product.

In detail, in the voltage converter 10, the input power $V\_in$ received by the power input terminal 100 may be DC power or AC power. When the input power $V\_in$ is detected to be AC power, the brown-out detector 108 may control operations of the AC to DC converter 102, to convert the AC power into the DC output voltage $V\_out$ and output the DC output voltage $V\_out$ to the power output terminal 110. When the input power $V\_in$ is detected to be DC power, the DC detector 106 may control the switch 104 to be turned on, in order to transfer the DC power to the power output terminal 110. As mentioned above, the voltage values of common AC power and DC power have no small difference; hence, both of the brown-out detector 108 and the DC detector 106 may perform determination based on the voltage of the input power $V\_in$. More specifically, since the AC power always possesses a larger voltage, the brown-out detector 108 may enable the operations of the AC to DC converter 102 only when the voltage of the input power $V\_in$ is large enough, e.g., the effective value is greater than 80 volts. On the other hand, since the DC power always comes from a battery having a specific voltage specification, the DC detector 106 may control the switch 104 to be turned on only when the voltage of the input power $V\_in$ is within a specific range, e.g., between 12 volts and 48 volts. Preferably, the DC detector 106 may detect the peak voltage of the input power $V\_in$ to perform the determination, but this is not a limitation of the present invention.

Figure 2:
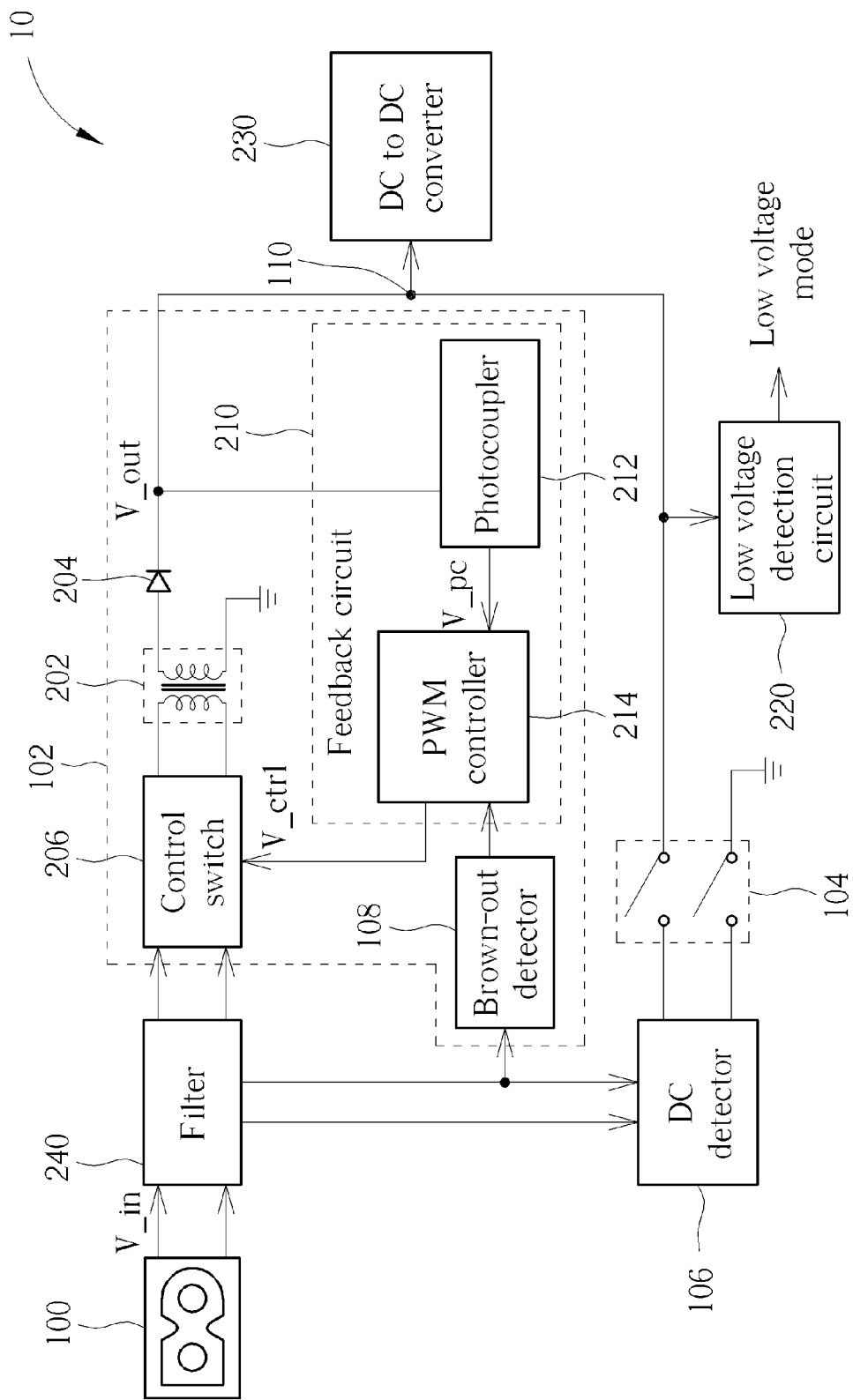
FIG. 2 is a schematic diagram of an implementation of the voltage converter.

Please refer to FIG. 2, which is a schematic diagram of an implementation of the voltage converter 10. As shown in FIG. 2, the switch 104 may be a normally open relay controlled by the DC detector 106. The normally open relay is open when the front-end mains electricity is supplied normally. The normally open relay is controlled to be closed only when the DC detector 106 detects that the voltage of the input power $V\_in$ enters the predefined voltage range. The predefined voltage range may be adjusted according to the voltage that can be outputted by the battery in the corresponding power supply module, and the voltage range should not be a limitation of the present invention. In addition to the brown-out detector 108, the AC to DC converter 102 further includes a conversion coil 202, a rectifier 204, a control switch 206 and a feedback circuit 210. The conversion coil 202 is used for performing conversion on the input power $V\_in$ to generate output power. The output power is further converted into the DC output voltage $V\_out$ via the rectifier 204. The AC to DC converter 102 then transmits the DC output voltage $V\_out$ to the power output terminal 110. The control switch 206, coupled to the front end of the conversion coil 202, is switched to control the magnitude of the input power $V\_in$ outputted to the conversion coil 202. The control switch 206 is controlled by the feedback circuit 210; that is, the feedback circuit 210 controls the operations of the control switch 206 according to the magnitude of the DC output voltage $V\_out$.

In detail, the feedback circuit 210 includes a photocoupler 212 and a pulse-width modulation (PWM) controller 214. The photocoupler 212, coupled to the rectifier 204, may generate a light coupled signal $V\_pc$ via light coupling according to the DC output voltage $V\_out$ outputted by the rectifier 204. The PWM controller 214, coupled to the photocoupler 212, may output a control signal $V\_ctrl$ to control the operations of the control switch 206 according to the light coupled signal $V\_pc$. According to the DC output voltage $V\_out$ to be generated, the PWM controller 214 may switch the control switch 206 via the control signal $V\_ctrl$, in order to adjust the magnitude of the input power $V\_in$ outputted to the conversion coil 202. In other words, in order to output the DC output voltage $V\_out$ having a specific voltage value, the PWM controller 214 may control the control switch 206 to be turned on or off with a specific frequency or cycle, so that the conversion coil 202 may generate output power with the specific voltage value. For example, if the AC to DC converter 102 needs to output the DC output voltage $V\_out$ having a higher voltage value, the time of the control switch 206 being turned on may be increased, in order to output the higher voltage value.

Please keep referring to FIG. 2. In the voltage converter 10, the PWM controller 214 is further coupled to and controlled by the brown-out detector 108, to output the control signal $V\_ctrl$ to control the operations of the control switch 206 according to a detection result of the brown-out detector 108. As mentioned above, the brown-out detector 108 may disable the AC to DC converter 102 when the voltage of the input power $V\_in$ is smaller than the predefined voltage. Therefore, when the voltage of the input power $V\_in$ is smaller than the predefined voltage, the brown-out detector 108 may control the control switch 206 to be fully turned off via the PWM controller 214, in order to stop the operations of the AC to DC converter 102.

In an embodiment, the voltage converter 10 may further include a low voltage detection circuit 220 for detecting the DC power passing through the switch 104. The low voltage detection circuit 220 may control the voltage converter 10 and related devices to enter a low voltage mode when the voltage of the DC power is within another predefined voltage range. In detail, when power outage occurs, the voltage outputted by the power supply module, e.g., a UPS, in the front end is a battery voltage having a lower level coming from the battery(s) in the power supply module. After the battery voltage is supplied for a period of time, the quantity of electric charges stored in the battery may fall gradually, such that the output voltage may fall. In such a condition, the voltage passing through the switch 104 to be transferred to the power output terminal 110 may also fall. When the low voltage detection circuit 220 detects that the voltage of the power output terminal 110 falls to a specific voltage range, the voltage converter 10 and related devices may enter the low voltage mode to prolong their life. If the voltage converter 10 is used for a cable modem having phone-call functions, the cable modem may disable its data transmission functions and only allow the user to make an emergency call in the low voltage mode. In addition, operations of the low voltage mode may also include enabling and disabling of several functions or adjustment of display brightness, and are not limited herein.

In an embodiment, the power output terminal 110 of the voltage converter 10 may be coupled to a DC to DC converter 230. The DC to DC converter 230 may receive the DC output voltage V_out or the DC input power V_in and convert it into the specific voltage to be outputted. For example, if the voltage converter 10 is used for a network communication product, different modules or devices in the network communication product may require different voltage levels. The DC to DC converter 230 may convert the power outputted by the voltage converter 10 into respective voltage and output the voltage to the corresponding module(s) or device(s). In an embodiment, a filter 240 may be disposed in the front end of the voltage converter 10, and the filter 240 is coupled to the power input terminal 100. When the input power V_in enters the voltage converter 10, the filter 240 may filter the noise in advance, in order to enhance the accuracy of follow-up voltage determination.

Please note that the present invention provides a voltage converter capable of receiving power from a power supply module on a power input terminal and determining whether the received power is DC power or AC power. Those skilled in the art can make modifications and alternations accordingly. For example, the voltage converter of the present invention may be applied to other type of electronic products in addition to network communication products. As long as the power receiving terminal is capable of receiving DC or AC power, the voltage converter of the present invention may detect the input power to determine whether the input power is DC power or AC power, in order to perform appropriate processing on the input power. In addition, the circuit structure of the voltage converter shown in FIG. 2 is only one of various implementations of the present invention. Those skilled in the art may implement an AC to DC converter having another structure or another type of switch. Also, the modules such as the filter, the DC to DC converter and the low voltage detection circuit may be selectively disposed according to system requirements. In addition, in the voltage converter of the present invention, any determination related to the voltage value may be performed according to the external battery box or the UPS. That is, according to the voltage range of the AC power and DC power outputted by the external battery box or UPS, those skilled in the art may determine the predefined voltage for the brown-out detector in the voltage converter to perform determination and the voltage range for the DC detector to perform determination.

To sum up, the present invention discloses a voltage converter capable of receiving DC power and AC power on the same terminal. The voltage converter may detect whether input power of a power input terminal is DC power or AC power. The voltage converter of the present invention may be applied to a network communication product, and receive power from a power supply module such as a UPS. The power supply module may output AC power in usual and output DC power from the battery(s) when power outage occurs. The voltage converter may detect the voltage of the input power to determine whether the input power is DC power or AC power. If the input power is determined to be AC power, the AC power may be converted into a DC output voltage via an AC to DC converter. If the input power is determined to be DC power, the DC power is transferred by a switch. As a result, the voltage converter of the present invention has the capability of processing both of the DC power and the AC power, and can effectively determine whether the received power is DC power or AC power, in order to perform appropriate processing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage converter, for determining whether an input power is direct current (DC) power or alternating current (AC) power, the voltage converter comprising:
   a power input terminal, for receiving the input power;
   an AC to DC converter, coupled to the power input terminal, for converting the AC power into a DC output voltage when the input power is the AC power, wherein the AC to DC converter comprises:
      a brown-out detector, for disabling the AC to DC converter when a voltage of the input power is smaller than a predefined voltage and enabling the AC to DC converter when the voltage of the input power is greater than the predefined voltage;
   a switch, coupled to the power input terminal, for passing the DC power when the input power is the DC power; and
   a DC detector, coupled to the power input terminal and the switch, for determining that the input power is the DC power and turning on the switch when the voltage of the input power is within a first predefined voltage range, and determining that the input power is the AC power and turning off the switch when the voltage of the input power is not within the first predefined voltage range.

2. The voltage converter of claim 1, wherein the switch is a normally open relay.

3. The voltage converter of claim 1, further comprising:
   a voltage detection circuit, for detecting the DC power passing the switch, and controlling the voltage converter to enter a low voltage mode when a voltage of the DC power is within a second predefined voltage range.

4. The voltage converter of claim 1, further comprising:
   a DC to DC converter, for receiving the DC output voltage or the DC power, and converting the DC output voltage or the DC power into a specific voltage and then outputting the specific voltage.

5. The voltage converter of claim 1, wherein the AC to DC converter further comprises:
   a conversion coil, for converting the input power into an output power;
   a rectifier, coupled to the conversion coil, for converting the output power into the DC output voltage, and outputting the DC output voltage;
   a control switch, coupled to the conversion coil, for being switched to control a magnitude of the input power outputted to the conversion coil; and
   a feedback circuit, comprising:
      a photocoupler, coupled to the rectifier, for generating a light coupled signal via light coupling according to the DC output voltage outputted by the rectifier; and
      a pulse-width modulation (PWM) controller, coupled to the photocoupler, for outputting a control signal to control operations of the control switch according to the light coupled signal.

6. The voltage converter of claim 5, wherein the PWM controller keeps switching the control switch via the control signal, to control the magnitude of the input power outputted to the conversion coil.

7. The voltage converter of claim 5, wherein the PWM controller is further coupled to the brown-out detector, for outputting the control signal to control the operations of the control switch according to a detection result of the brown-out detector.

8. The voltage converter of claim 1, wherein the input power comes from a power supply module having a capability of outputting the DC power and the AC power.

9. The voltage converter of claim 8, wherein the power supply module is an external battery box or an uninterruptible power system (UPS).

10. The voltage converter of claim 8, wherein the input power outputted by the power supply module is the AC power of mains electricity when the mains electricity is supplied normally, and the input power outputted by the power supply module is the DC power generated by a battery in the power supply module when the mains electricity is not supplied.

* * * * *